(12) United States Patent
Chen et al.

(10) Patent No.: US 12,543,409 B2
(45) Date of Patent: Feb. 3, 2026

(54) SEMICONDUCTOR LIGHT-EMITTING DEVICE

(71) Applicant: XIAMEN SANAN OPTOELECTRONICS CO., LTD., Xiamen (CN)

(72) Inventors: Gong Chen, Xiamen (CN); Sheng-Hsien Hsu, Xiamen (CN); Su-Hui Lin, Xiamen (CN); Kang-Wei Peng, Xiamen (CN); Ling-Yuan Hong, Xiamen (CN); Minyou He, Xiamen (CN)

(73) Assignee: XIAMEN SANAN OPTOELECTRONICS CO., LTD., Xiamen (CN)

( * ) Notice: Subject to any disclaimer, the term of this patent is extended or adjusted under 35 U.S.C. 154(b) by 682 days.

(21) Appl. No.: 17/930,109

(22) Filed: Sep. 7, 2022

(65) Prior Publication Data

US 2023/0006096 A1    Jan. 5, 2023

Related U.S. Application Data

(63) Continuation-in-part of application No. PCT/CN2020/079155, filed on Mar. 13, 2020.

(51) Int. Cl.
*H10H 20/819*    (2025.01)
*H10H 20/01*    (2025.01)

(52) U.S. Cl.
CPC .... *H10H 20/819* (2025.01); *H10H 20/01335* (2025.01)

(58) Field of Classification Search
CPC ........... H10H 20/819; H10H 20/01335; H10H 20/034; H10H 29/036; H10H 20/01; H10H 20/821; H10H 20/84
See application file for complete search history.

(56) References Cited

U.S. PATENT DOCUMENTS

2010/0140653 A1    6/2010   Lin et al.
2020/0243714 A1*   7/2020   Chang .................. G02B 6/0073

FOREIGN PATENT DOCUMENTS

CN    107689407 A    2/2018
CN    110828628 A    2/2020

OTHER PUBLICATIONS

Search Report issued to PCT application No. PCT/CN2020/079155 on Nov. 26, 2020.

* cited by examiner

*Primary Examiner* — Karen Kusumakar
(74) *Attorney, Agent, or Firm* — Thomas Horstemeyer, LLP

(57) ABSTRACT

A semiconductor light-emitting device includes a light-transmissible substrate, and a semiconductor light-emitting stack. The light-transmissible substrate is made of a first material, and has a first surface and a second surface opposite to the first surface. The first surface has a first region, and a second region which is formed with a plurality of protruding portions and a plurality of recessed portions formed therebetween. The recessed portions are disposed at a level lower than that of the first region relative to the second surface. The semiconductor light-emitting stack is disposed on the first region of the first surface along a stacking direction.

20 Claims, 7 Drawing Sheets

SEMICONDUCTOR LIGHT-EMITTING DEVICE

CROSS-REFERENCE TO RELATED APPLICATION

This application is a bypass continuation-in-part (CIP) application of PCT International Application No. PCT/CN2020/079155, filed on Mar. 13, 2020. The entire content of the international patent application is incorporated herein by reference.

FIELD

The disclosure relates to a semiconductor light-emitting device.

BACKGROUND

Semiconductor light-emitting devices such as light-emitting diode (LED) have various advantages, for instance, small volume, high light intensity and low power consumption, and thus are widely applied in display, backlight source and lightings.

Semiconductor light-emitting devices may be packaged as, for instance, face-up type, flip-chip type and vertical type of semiconductor light-emitting devices according to shapes and/or electrode position thereof.

FIG. 1 illustrates a conventional face-up semiconductor light-emitting device that emits blue light. The conventional face-up semiconductor light-emitting device includes a sapphire substrate serving as a light-transmissible substrate 90, and a semiconductor light-emitting stack including a first semiconductor layer 91, an active layer 92 and a second semiconductor layer 93 that are sequentially disposed on the sapphire substrate in such order. The conventional face-up semiconductor light-emitting device may further include light-transmissible insulating layer (not shown) that surrounds the semiconductor light-emitting stack.

For a light emitted from the active layer 92, a portion of the light emits along a direction (a) toward the second semiconductor layer 93. Another portion of the light emits along a direction (b) toward a sidewall of the semiconductor light-emitting stack. Yet another portion of the light emits along a direction (c) toward the light-transmissible substrate 90. Since the semiconductor light-emitting stack, the insulating layer and the light-transmissible substrate 90 may have different refractive indices, the light emitted along the directions (a), (b), and (c) is susceptible to internal reflection within the semiconductor light-emitting device, resulting in a relatively low light extraction efficiency.

FIG. 2 shows another conventional semiconductor light-emitting device similar to that shown in FIG. 1, except for the following differences made to enhance the light extraction efficiency of the another semiconductor light-emitting device. For instance, a top surface of the second semiconductor layer 93 serving as a light-emitting surface may be patterned or roughened to have different critical angles. As such, light emitted along the direction (a) may be diffracted and directed to exit the semiconductor light-emitting device, so as to enhance light extraction efficiency through the light-emitting surface.

In addition, a sidewall of the semiconductor light-emitting stack may be formed as an inclined sidewall, which is also conducive to enhancing light extraction efficiency through the light-emitting surface.

As shown in FIG. 2, the semiconductor light-emitting device may further include a plurality of protrusions 97 with inclined lateral surfaces formed on the light-transmissible substrate 90, such that light emitted along direction (c) may be reflected back toward the light-emitting surface. The protrusions 97 might be made of a material (e.g., silicon oxides) having a refractive index lower than that of sapphire which is used for making the light-transmissible substrate 90. As such, a great difference in refractive indices between the semiconductor light-emitting stack and the protrusions 97 allows a large amount of the light emitted along direction (c) to be reflected back toward the light-emitting surface.

Moreover, the light emitted along a direction (d) may be partially reflected by an upper surface of the light-transmissible substrate 90 exposed from the protrusions 97, or may penetrate through a backside of the light-transmissible substrate 90 opposite to the light-emitting surface. Therefore, the semiconductor light-emitting device may further include a reflective layer 96 disposed on the backside of the light-transmissible substrate 90, so as to reflect and direct such light to exit the semiconductor light-emitting device through a sidewall of the light-transmissible substrate 90, a sidewall of the semiconductor light-emitting stack, or the light-emitting surface. When the light is reflected back to the upper surface of the light-transmissible substrate 90 (which is a planar surface), the reflected light might be undesirably reflected back to and transmitted within the light-transmissible substrate 90, or even absorbed by the semiconductor light-emitting device, causing reduced light extraction efficiency.

SUMMARY

Therefore, an object of the disclosure is to provide semiconductor light-emitting devices that can alleviate at least one of the drawbacks of the prior art.

In a first aspect, the semiconductor light-emitting device includes a light-transmissible substrate, and a semiconductor light-emitting stack. The light-transmissible substrate is made of a first material, and has a first surface and a second surface opposite to the first surface. The first surface has a first region, and a second region which is formed with a plurality of protruding portions and a plurality of recessed portions formed therebetween. The recessed portions are disposed at a level lower than that of the first region relative to the second surface. The semiconductor light-emitting stack is disposed on the first region of the first surface along a stacking direction.

In a second aspect, the semiconductor light-emitting device includes a light-transmissible substrate and a semiconductor light-emitting stack. The light-transmissible substrate is made of a first material, and has a first surface and a second surface opposite to the first surface along a stacking direction. The first surface has a first region and a second region. The first region has a first surface area, and a first projected area on an imaginary surface that is perpendicular to the stacking direction. The second region has a second surface area, and a second projected area on the imaginary surface that is perpendicular to the stacking direction. A ratio of the second surface area to the second projected area is greater than a ratio of the first surface area to the first semiconductor light-emitting projected area. The stack is disposed on the first region along the stacking direction.

In a third aspect, the semiconductor light-emitting device includes a light-transmissible substrate and a semiconductor light-emitting stack. The light-transmissible substrate is made of a first material and has a first surface and a second surface opposite to the first surface along a stacking direction. The first surface has a first region, and a second region which is formed with a plurality of protruding portions and a plurality of recessed portions formed therebetween. The first region has a first surface area, and a first projected area on an imaginary surface that is perpendicular to the stacking direction. The second region has a second surface area, and a second projected area on the imaginary surface that is perpendicular to the stacking direction. A ratio of the second surface area to the second projected area is greater than a ratio of the first surface area to the first projected area. The semiconductor light-emitting stack is disposed on the first region of the first surface along the stacking direction.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
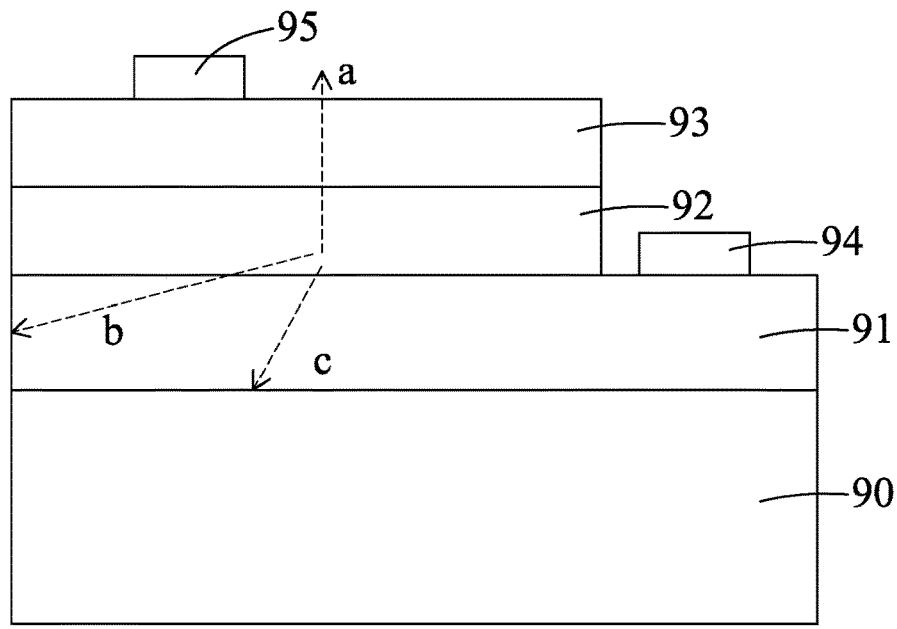
FIGS. 1 and 2 are schematic views illustrating various conventional semiconductor light-emitting devices.
Figure 2:
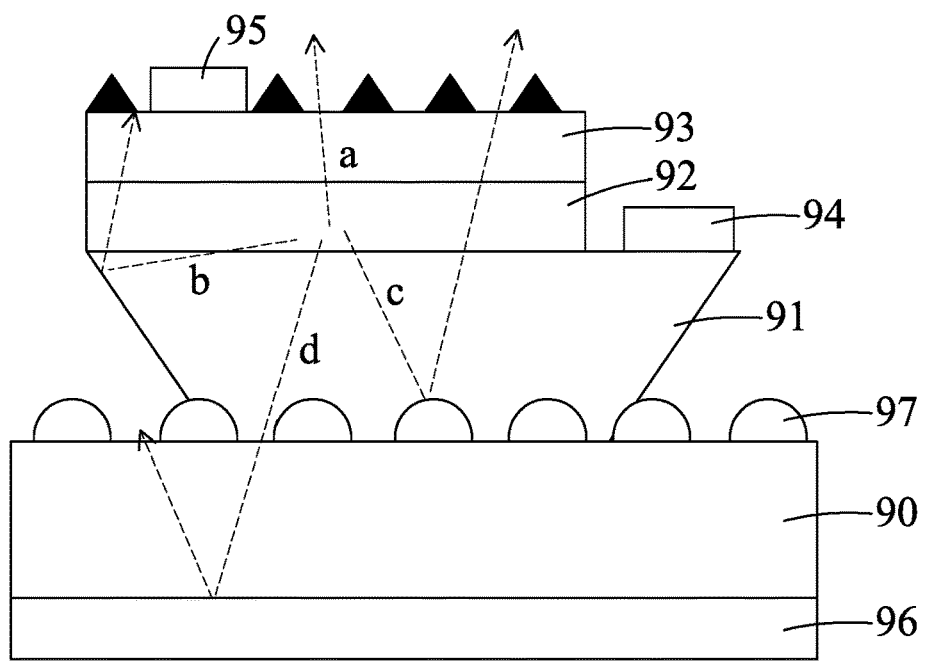

Before the disclosure is described in greater detail, it should be noted that where considered appropriate, reference numerals or terminal portions of reference numerals have been repeated among the figures to indicate corresponding or analogous elements, which may optionally have similar characteristics.

Figure 3:
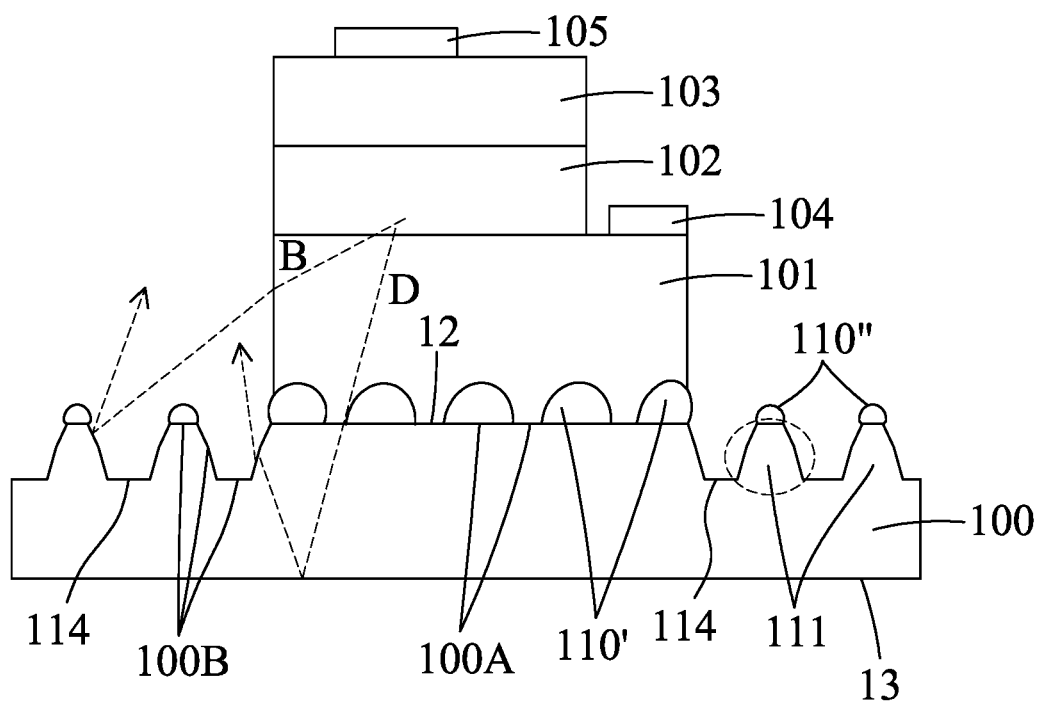
FIG. 3 is a schematic view illustrating a first embodiment of a semiconductor light-emitting device according to the disclosure.

Referring to FIG. 3, a first embodiment of a semiconductor light-emitting device according to the disclosure includes a light-transmissible substrate 100, and a semiconductor light-emitting stack disposed on the light-transmissible substrate 100 along a stacking direction. In some embodiments, the semiconductor light-emitting device is a face-up semiconductor light-emitting device. A light exits the semiconductor light-emitting device mainly through an upper surface of the semiconductor light-emitting device opposite to the light-transmissible substrate 100.

The light-transmissible substrate 100 has a first surface 12, and a second surface 13 opposite to the first surface 12. The first surface 12 has a first region 100A and a second region 100B. The first region 100A may be planar, or non-planar. In this embodiment, the first region 100A is planar.

The first region 100A has a first surface area, and a first projected area on an imaginary surface that is perpendicular to the stacking direction. The second region 100B has a second surface area, and a second projected area on the imaginary surface that is perpendicular to the stacking direction. A ratio of the second surface area to the second projected area is greater than a ratio of the first surface area to the first projected area.

The semiconductor light-emitting stack is disposed on the first region 100A surrounded by the second region 100B. The semiconductor light-emitting stack includes a first-type semiconductor layer 101, an active layer 102, and a second-type semiconductor layer 103 that are sequentially disposed on the first region 100A of the first surface 12 along the stacking direction away from the first region 100A.

The semiconductor light-emitting device further includes a first electrode 104 that is disposed on and electrically connected to the first-type semiconductor layer 101, and a second electrode 105 that is disposed on and electrically connected to the second-type semiconductor layer 103.

By having the ratio of the second surface area to the second projected area greater than the ratio of the first surface area to the first projected area, the second region 100B may have a larger specific surface area and a greater surface roughness than those of the first region 100A. That is, the second region 100B has a relatively larger portion of bumpy surfaces than that of first region 100A, which is conducive to allowing a light transmitting along a direction (D) (i.e., the light passing through the first surface 12 of the light-transmissible reflected at the second substrate 100 and being surface 13) to be diffracted and directly exit the semiconductor light-emitting device through the second region 100B. As such, internal reflection and transmission path of the light within the light-transmissible substrate 100 is reduced, so as to reduce light loss and increase light extraction efficiency of the semiconductor light-emitting device. In addition, a portion of the light transmitting along a direction (B) (i.e., the light emitted from the active layer 102 and exiting sidewall of the semiconductor light-emitting stack) may reach and may be reflected at the second region 100B and then transmitted in a direction away from the light-transmissible substrate 100, so that light extraction efficiency may be further increased.

A method for manufacturing the first embodiment of the semiconductor light-emitting device includes the following steps.

Figure 4:
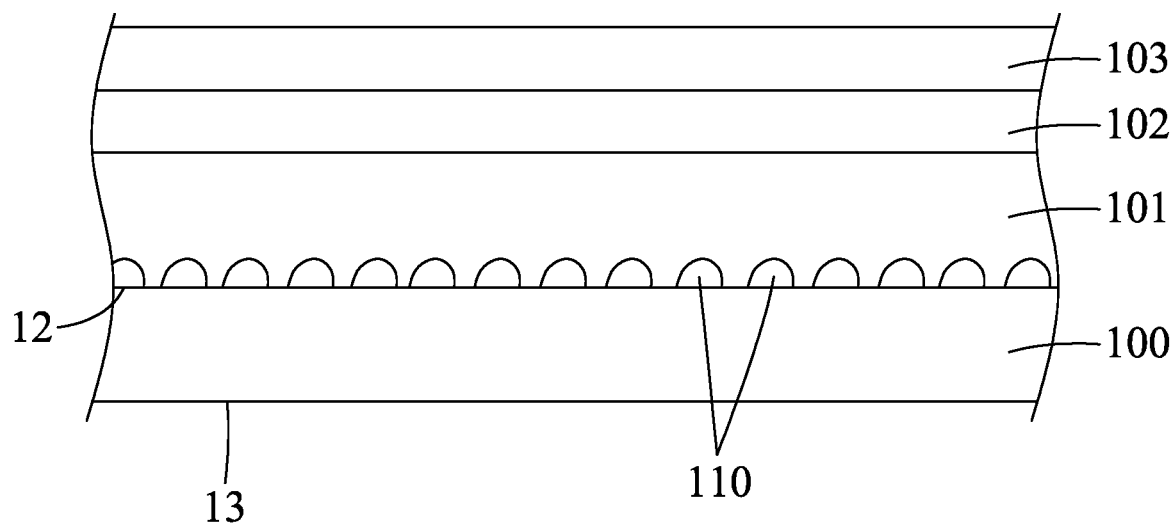
FIGS. 4 to 8 are schematic views illustrating consecutive steps of a method for manufacturing the first embodiment of the semiconductor light-emitting device according to the disclosure.

Referring to FIG. 4, in step A, the semiconductor light-emitting stack is epitaxially grown on the first surface 12 of the light-transmissible substrate 100. In this embodiment, the first surface 12 of the light-transmissible substrate 100 is planar.

Specifically, the light-transmissible substrate 100 made of a first material is provided. In some embodiments, the first material of f the light-transmissible substrate 100 is sapphire, which has a refractive index of approximately 1.7.

The semiconductor light-emitting stack is then formed on the first surface 12 of the light-transmissible substrate 100 through an epitaxial process. The epitaxial process may be a metal-organic chemical vapor deposition (MOCVD) process, a molecular beam epitaxy (MBE) process, a hydride vapor phase epitaxy (HVPE) process, or the like. In certain embodiments, the semiconductor light-emitting stack is a nitride semiconductor light-emitting stack having a refractive index ranging from approximately 2.5 to 3.0, which is higher than that of the light-transmissible substrate 100 made of sapphire.

The semiconductor light-emitting stack includes the first-type semiconductor layer 101 (serving as an n-type layer), the active layer 102, the second-type semiconductor layer 103 (serving as a p-type layer) that are sequentially formed on the first surface 12 of the light-transmissible substrate 100 along the stacking direction away from the light-transmissible substrate 100.

Each of the first-type and second-type semiconductor layers 101, 103 may independently made of $Al_xIn_{1-x}GaN$, wherein $0 \le x \le 1$.

The active layer 102 may include InGaN well layers and GaN or AlGaN epitaxial layers that are alternately stacked on one another. The active layer 102 may emit light with a wavelength ranging from 420 nm to 550 nm, such as a blue light, or a green light.

The semiconductor light-emitting stack may further include an aluminum nitride (AlN) buffer layer (not shown) formed between the first-type semiconductor layer 101 and the light-transmissible substrate 100. The AlN buffer layer may effectively reduce lattice mismatch between the light-transmissible substrate 100 and the first-type semiconductor layer 101. The AlN buffer layer may have a thickness ranging from 0.5 nm to 5 µm.

In certain embodiments, before the epitaxial growth of the semiconductor light-emitting stack, a plurality of convex structures 110 are formed on the first surface 12 and then are covered by the semiconductor light-emitting stack. The convex structures 110 may include a plurality of first convex structures 110' formed on the first region 100A, and a plurality of the second convex structures 110" formed on the second region 100B. The convex structures 110 are made of a second material that is different from the first material. The second material may have a refractive index smaller than that of the first material. The first and second convex structures 110', 110" may be made of identical materials. Examples of the second material may include, but are not limited to, silicon oxides, silicon nitrides, metal oxides, or combinations thereof.

The reflectance of the light emitted by the active layer 102 at the interface between the convex structures 110 and the semiconductor light-emitting stack is greater than the reflectance of the light incident on the light-transmissible substrate 100, so as to improve light extraction efficiency in a direction away from the light-transmissible substrate 100.

Each of the convex structures 110 is formed with a cone-like shape, and includes a top portion and a lower portion that are respectively distal from and proximal to the light-transmissible substrate 100, and a sidewall that interconnects the top portion and the lower portion. The sidewall may have a constant, or non-constant slope. Each of projections of the top portion and the lower portion on the second surface 13 of the light-transmissible substrate 100 may be a circle. The top portion may have a width smaller than that of the lower portion. That is, each of the convex structures 110 may be formed in a frustrated cone shape. In some embodiments, the projection of the top portion is a point, and has a width of 0. That is, each of the convex structures 110 has a cone shape.

The convex structures 110 may be spaced apart from one another by a distance ranging from 0.01 µm to 0.9 µm. In some embodiments, the convex structures 110 are spaced apart from one another by a fixed distance.

In certain embodiments, the convex structures 110 are formed in curved configurations, i.e., the sidewalls of the convex structures 110 are protruded and may have non-constant slopes. In comparison with the sidewalls having constant slopes, the sidewalls having non-constant slopes allow more diffractions for the light incident on such convex structure(s) 110, so as to enhance light extraction efficiency. Such curved configuration of the convex structures 110 may be formed using a dry etching process.

A projection of each of the convex structures 110 on the second surface 13 may independently have a width ranging from 0.1 µm to 10 µm, and each of the convex structures may independently has a height ranging from 0.1 µm to 3 µm.

The convex structures 110 may be formed by a thin film deposition process, followed by a photolithography process in combination with an etching process. For instance, when forming the convex structures 110 made of silicon dioxide, a silicon oxide thin film is first deposited on the light-transmissible substrate 100. Then, the photolithography process and the etching process, such as a dry etching or a wet etching process, are performed on the silicon oxide thin film to obtain the convex structures 110. Specifically, a mask pattern having a predetermined size and shape is first formed over the silicon oxide thin film, then the etching process is performed over the mask pattern, so as to obtain the convex structures 110 with the predetermined size and shape. In certain embodiments, the dry etching process is an inductively coupled plasma (ICP) etching process using etching gas such as boron trichloride ($BCl_3$), hydrogen bromide (HBr), sulphur hexafluoride ($SF_6$), tetrafluoromethane ($CF_4$), octafluorocyclobutane ($C_4F_8$), trifluoromethane ($CHF_3$), argon (Ar) or oxygen ($O_2$). In other embodiments, the wet etching process is conducted using, for example, but not limited to, hydrogen fluoride (HF) solution or a buffered oxide etch (BOE) solution.

Figure 5:
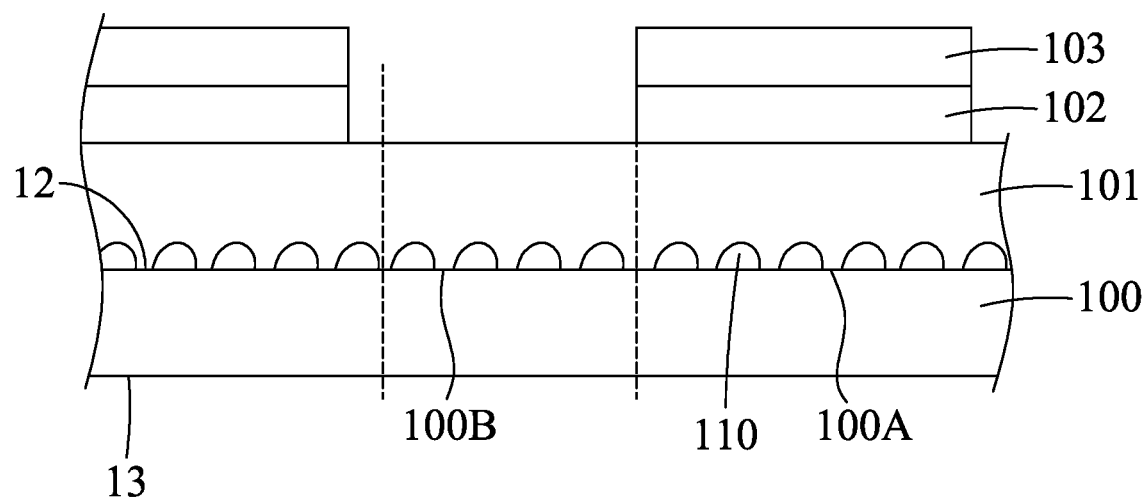

In step B, referring to FIG. 5, a portion of the second-type semiconductor layer 103 and a portion of the active layer 102 are removed by etching to expose a portion of the first-type semiconductor layer 101. An unetched portion of the active layer 102 and an unetched portion of the second-type semiconductor layer 103 are formed into a mesa structure. As shown in FIG. 3, the first electrode 104 (serving as an n-electrode) is to be disposed on the exposed portion of the first-type semiconductor layer 101, and the second electrode 105 (serving as a p-type electrode is to be formed on the unetched second-type semiconductor layer 103 of the mesa structure. In some embodiments, a dry etching process, such as ICP etching is used for removal of the portion of the second-type semiconductor layer 103 and the portion of the active layer 102.

Figure 6:
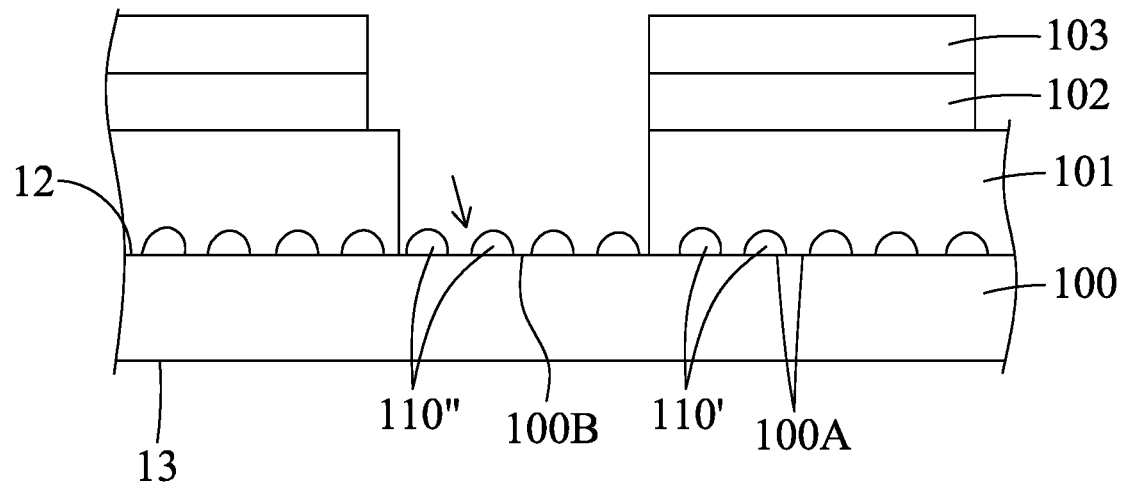

In step C, referring to FIG. 6, the exposed portion of the first-type semiconductor layer 101 is further removed to expose the second region 110B of the first surface of the light-transmissible substrate 100 and the convex structures 110 formed thereon. The removal of the exposed portion of the first-type semiconductor layer 101 may be performed by a dicing process, such as laser cutting, or an ICP etching process. Therefore, the first region 100A of the first surface 12, on which the semiconductor light-emitting stack is disposed, is surrounded by the second region 100B.

Considering that the first surface 12 is relatively planar, in this step, the ratio of the first surface area to the first projected area is approximately 1:1, and the ratio of the second surface area to the second projected area is approximately 1:1. The first and second surface areas and the first and second projected areas take no account of the first convex structures 110', and the second convex structures 110".

Figure 7:
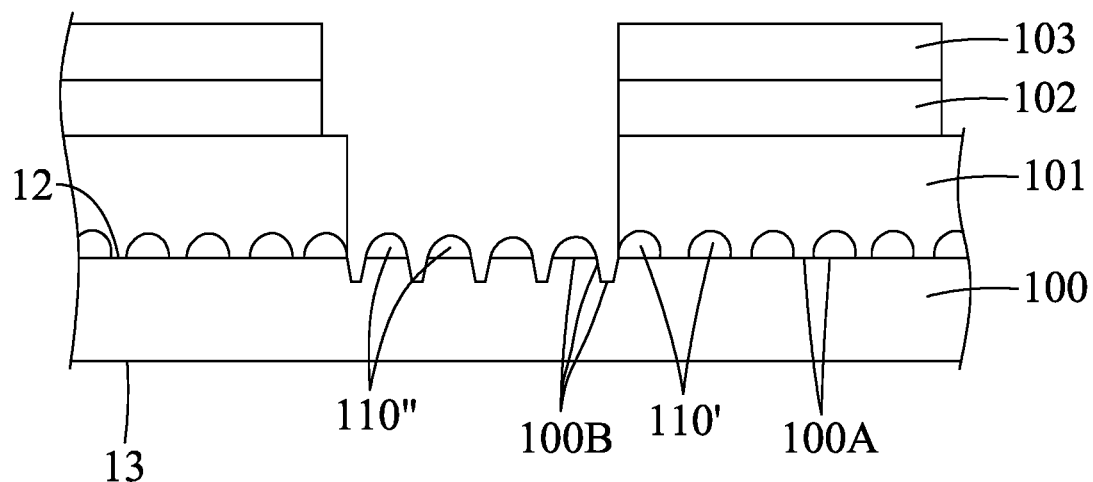
Figure 8:
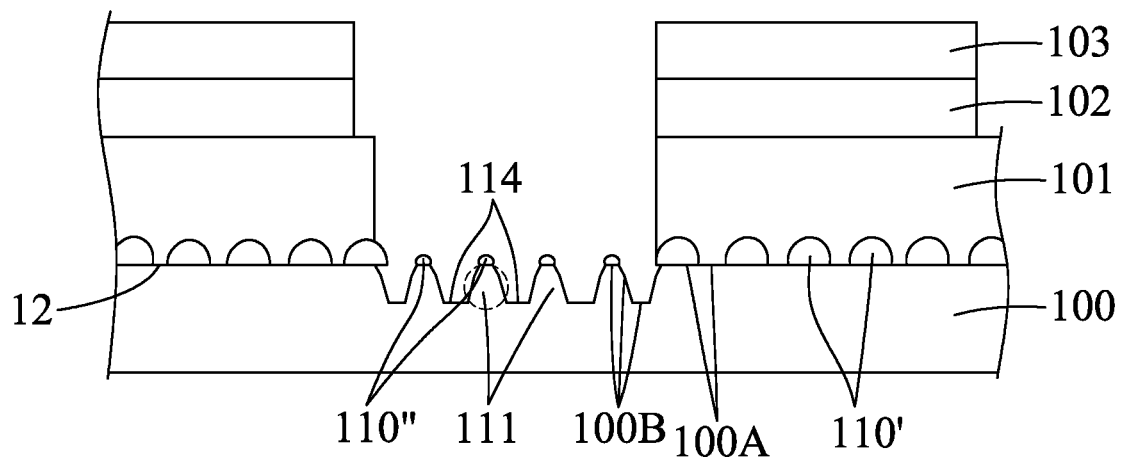

In step D, referring to FIGS. 7 and 8, the second region 100B is subjected to an etching treatment so as to obtain a plurality of protruding portions 111 and a plurality of recessed portions 114 formed therebetween. As such, the second region 100B is roughed and becomes non-planar, and has a relatively larger portion of bumpy surfaces than that of first region 100A. The second region 100B may have a unit surface area larger than that of the first region 100A. That is, a ratio of the second surface area to the second projected area is greater than a ratio of the first surface area to the first projected area.

The recessed portions 114 is located at a level lower than that of the first region 100A relative to the second surface 13.

Each of the protruding portions 111 has a top part and a bottom part respectively distal from and proximal to the second surface 13, and at least one inclined sidewall. The top part connects the inclined sidewall opposite to the second surface 13, and is formed in one of a point shape and a plate shape. The at least one inclined sidewall extends in a direction away from the second surface 13 and has a constant slope.

When each of the protruding portions 111 is formed with a relatively large ratio of a distance between the top and bottom parts (i.e., the height of each protruding portions 111) to a width of the bottom part, the inclined sidewall may have a greater surface area, which is conducive to allowing more light reaching the protruding portions 111 after being reflected from the second surface 13 to exit the semiconductor light-emitting device (i.e., along a direction (D) shown in FIG. 3). However, when such ratio is too small, the inclined sidewall forms a relatively small included angle with the bottom part, and less amount of light reaching the protruding portions 111 after being reflected from the second surface could be diffracted to exit the semiconductor light-emitting device, while too large ratio would result in a larger amount of light being confined within the protruding portions 111, causing loss of light. In certain embodiments, for each of the protruding portions 111, the ratio of the distance between the top and bottom parts to the width of the bottom part ranges from 1:1 to 1:3. In certain embodiments, the height of each of the protruding portions 111 (the distance between the top and bottom parts thereof) independently ranges from 0.1 μm to 2 μm.

In certain embodiments, the etching treatment is a wet etching process, in which an etchant solution is used to etch the second region 100B horizontally (i.e., perpendicular to the stacking direction of the semiconductor light-emitting stack) and vertically (i.e., along the stacking direction), so that the protruding portions 111 having the inclined sidewall and the recessed portions 114 are obtained, thereby increasing the second surface area.

In this embodiment, the light-transmissible substrate 100 is made of a sapphire single crystal, and the etchant solution used in step D includes a mixture of sulphuric acid and phosphoric acid. A volume ratio of phosphoric acid to sulphuric acid may range from 1:1.5 to 1:5, such as 1:2.5 to 1:4. The wet etching process may be performed at a temperature ranging from 240° C. to 280° C.

Specifically, the wet etching process of step D is illustrated with reference to FIGS. 6 to 8. During the wet etching process, the second convex structures 110" serve as masks to cover the second region 100B of the light-transmissible substrate 100 underneath (see the arrow shown in FIG. 6). The etchant solution etches the light-transmissible substrate 100 along (i.e., the stacking the vertical direction direction), such that the second region 100B of the first surface 12 not covered by the second convex structures 110" is formed with a plurality of recesses that extend toward the second surface 13, and the second region 100B of the light-transmissible substrate 100 covered by the second convex structures 110" is formed into a plurality of protrusions with inclined surfaces. Since the wet etching process may proceed in an isotropic manner, the light-transmissible substrate 100 are further horizontally etched along the inclined surfaces of the protrusions, and vertically etched along the recesses, until the protruding portions 111 and the recessed portions 114 having desired height and width are obtained.

During the wet etching process, different planes of the sapphire single crystal of the light-transmissible substrate 100 (e.g., R-plane, C-plane or A-plane) may experience different etching rates, such that the protruding portions 111 thus obtained may include the at least one inclined sidewall with the constant slope due to exposure of etched crystal plane.

In this embodiment, during the wet etching process, the second convex structures 110" are partially etched, so that a portion of each of the second convex structures 110" would remain on the protruding portions 111, i.e., the protruding portions 111 of the second region 100B are still covered by the second convex structures 110" as shown in FIG. 8. In other embodiments, the second convex structure 110' are completely etched to expose the top parts of the protruding portions 111.

In step E, referring to FIG. 3, the first electrode 104 and the second electrode 105 are formed to be electrically connected to the first-type semiconductor layer 101 and the second-type semiconductor layer 103, respectively.

Specifically, a transparent conductive thin film (not shown) may be first formed on the second-type semiconductor layer 103. The transparent conductive thin film may be indium tin oxide (ITO) film, aluminum doped zinc oxide (AZO) film, or transparent conductive glass.

Then, the first electrode 104 is formed on the top surface of the first-type semiconductor layer 101, and the second electrode 105 is formed on the transparent conductive thin film. Both the first and second electrodes 104, 105 are disposed on the semiconductor light-emitting stack opposite to the light-transmissible substrate 100. In certain embodiments, each of the first and second electrodes 104, 105 is independently made of one of chromium (Cr), platinum (Pt), gold (Au), titanium (Ti), nickel (Ni), aluminum (Al), molybdenum (Mo), palladium (Pd), or combinations thereof.

In some embodiments, an insulating layer (not shown) is formed to cover the semiconductor light-emitting stack and the second region 100B.

A dicing process may be further performed on the second region 100B so as to obtain a plurality of the semiconductor light-emitting devices according to the disclosure which are separated from one another (see FIG. 3).

In some embodiments, a distributed Bragg reflector (DBR), or a metallic reflective layer made of silver or aluminum, may be disposed on the second surface 13 so as to increase light extraction efficiency of the semiconductor light-emitting devices.

Referring to FIG. 3, in the semiconductor light-emitting device of the present disclosure, the second region 100B is fabricated to obtain the protruding portions 111 and the recessed portions 114, so that the ratio of the second surface area to the second projected area is greater than the ratio of the first surface area to the first projected area, i.e., the second region 100B has a greater specific surface area, a greater surface roughness and more inclined surfaces, which is conducive to increasing amount of light exiting through the second region 100B (i.e., along the direction D), or to reflect light reaching thereon toward the upper surface of the semiconductor light-emitting device (i.e., along the direction B).

Figure 9:
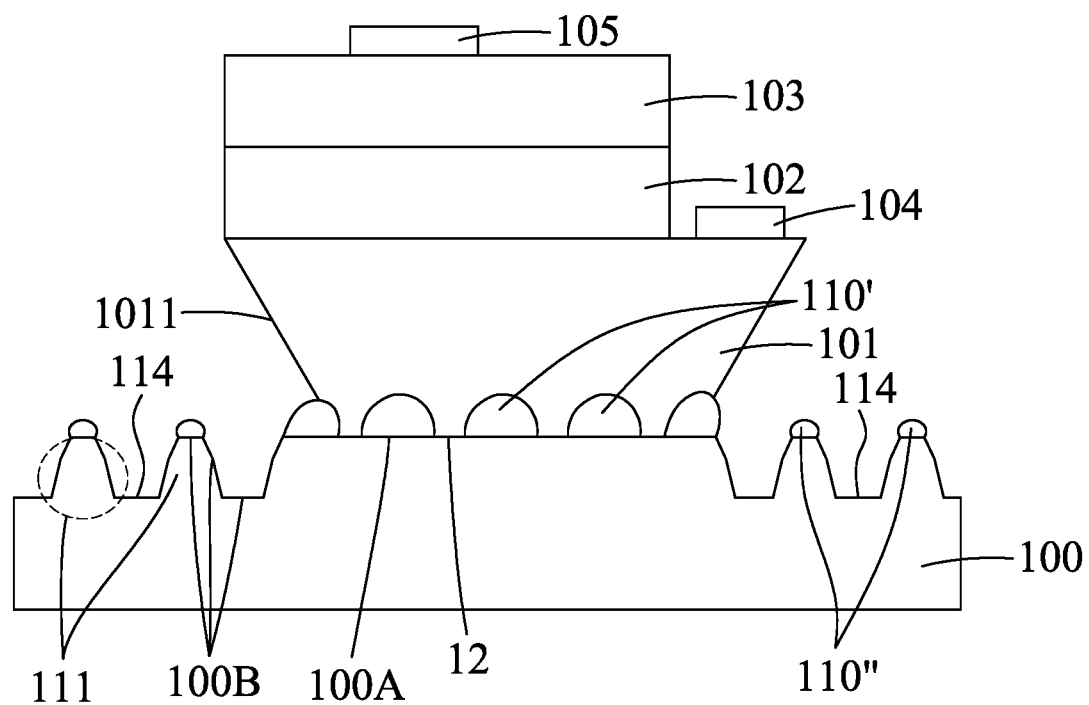
FIG. 9 is a schematic view illustrating a second embodiment of the semiconductor light-emitting device according to the disclosure.

Referring to FIG. 9, a second embodiment of the semiconductor light-emitting device and the method for manufacturing the same are generally similar to the first embodiment, except for the following differences.

Specifically, the first-type semiconductor layer 101 has an upper surface distal from the first surface 12, and a peripheral wall connected to the upper surface, and during step D of the method for manufacturing the second embodiment, a lateral surface of the semiconductor light-emitting stack, or at least the peripheral wall of the first-type semiconductor layer 101 (along with a peripheral wall of the AlN buffer layer, if present) is also subjected to the wet etching process using the etchant solution including the mixture of sulphuric acid and phosphoric acid. It is noted that when phosphoric acid is present in a volume larger than that of sulphuric acid in the etchant solution, the etchant solution has a higher etching rate to the first-type semiconductor layer 101 than to the light-transmissible substrate 100 made of sapphire. In addition, when sulphuric acid is present in a volume larger than that of phosphoric acid in the etchant solution, the etchant solution has a higher etching rate to the light-transmissible substrate 100 made of sapphire than to the first-type semiconductor layer 101. To obtain the semiconductor light-emitting stack and the second region 100B with the desired structure according to the present disclosure, in certain embodiments, phosphoric acid and sulphuric acid are present in the etchant solution at a volume ratio ranging from 1:1.5 to 1:5.

By virtue of the aforesaid process, the first-type semiconductor layer 101 has an upper surface that is distal from the first surface 12, and a peripheral wall that is connected to the upper surface and that has at least one inclined surface 1011. The at least one inclined surface 1011 may form an acute angle, i.e., less than 90°, relative to the upper surface. The inclined surface 1011 may serve as a total internal reflection surface which reflects light incident thereon toward the upper surface of the semiconductor light-emitting device or any other region located at a level higher than the first-type semiconductor layer 101 relative to the light-transmissible substrate 100, so as to increase light extraction efficiency. In certain embodiments, the peripheral wall of the first-type semiconductor layer 101 may have a plurality of the inclined surfaces 1011, each of which may be or may not be parallel to each other.

Figure 10:
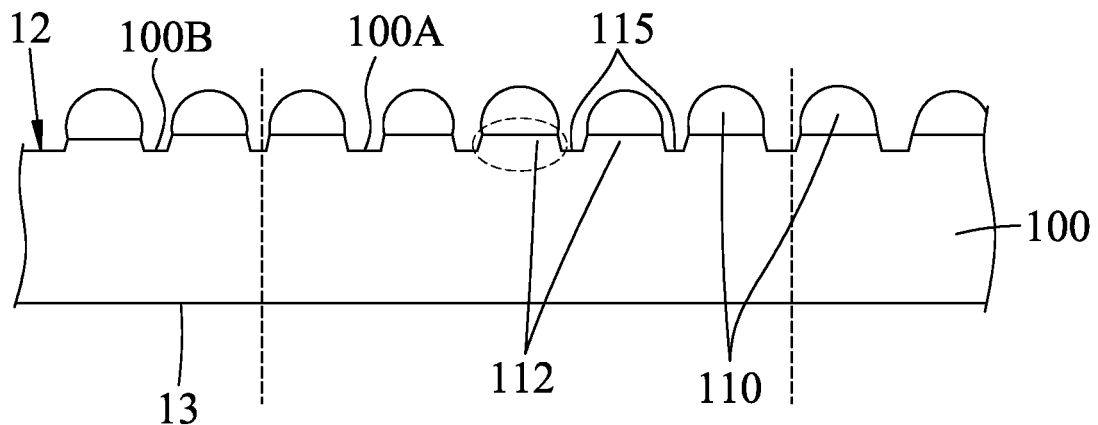
FIG. 10 is a schematic view illustrating a light-transmissible substrate of a third embodiment of the semiconductor light-emitting device according to the disclosure.
Figure 11:
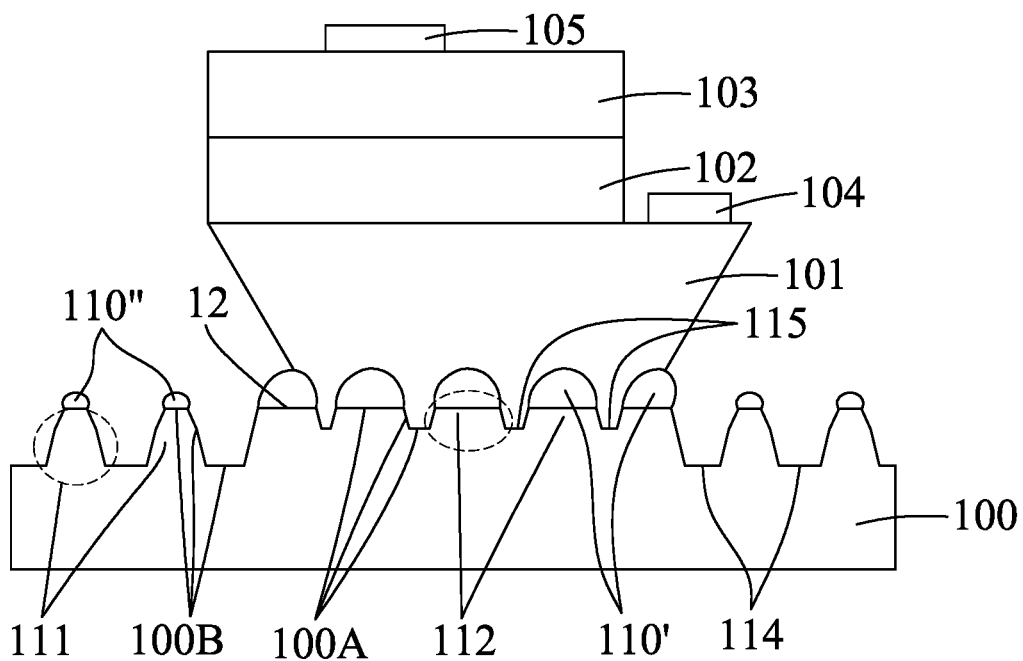
FIG. 11 is a schematic view illustrating the third embodiment of the semiconductor light-emitting device according to the disclosure.

Referring to FIGS. 10 and 11, a third embodiment of the semiconductor light-emitting device and the method for manufacturing the same are generally similar to the second embodiment, except that the first surface 12 of the light-transmissible substrate 100 is non-planar (see FIG. 10). Specifically, in step A of the method for manufacturing the third embodiment, the etching gas used in the dry etching process for forming the convex structures 110 may also etch the first surface 12, such that the first surface 12 is formed with a plurality of protruding parts on which the convex structures 110 are disposed, and a plurality of recessed parts formed therebetween.

In this embodiment, the first region 100A is non-planar, and the protruding parts and the recessed parts formed thereon are denoted as protruding portions 112 and recessed portions 115 shown in FIG. 11. The first convex structures 110' are formed on the protruding portions 112. A ratio of a height of each of the first convex structures 110' to a height of each of the protruding portions 112 of the first region 100A may be not less than 9:1, so that the first convex structures 110' may more effectively reflect light. In addition, formation of the protruding portions 112 and the recessed portions 115 on the first region 100A causes the ratio of the first surface area to the first projected area to be greater than 1.

In addition, step D of the method, the protruding parts and the recessed parts formed on the second region 100B are subjected to the wet etching process in which the etching solution may further horizontally etch the inclined surfaces of the protruding parts, and vertically etch the recessed parts, so as to form the protruding portions 111 and the recessed portions 114 having greater depth on the second region 100B. The recessed portions 114 on the second region 100B are at a level lower than the recessed portions 115 of the first region 100A relative to the second surface 13. That is, the protruding portions 111 of the second region 100B have a larger area of inclined surfaces than that of the protruding portions 112 of the first region 100A. The ratio of the second surface area to the second projected area is greater than the ratio of the first surface area to the first projected area, which is conducive to allowing more light to be diffracted at the second region 100B and to directly exit the semiconductor light-emitting device (i.e., improving light extraction efficiency).

Figure 12:
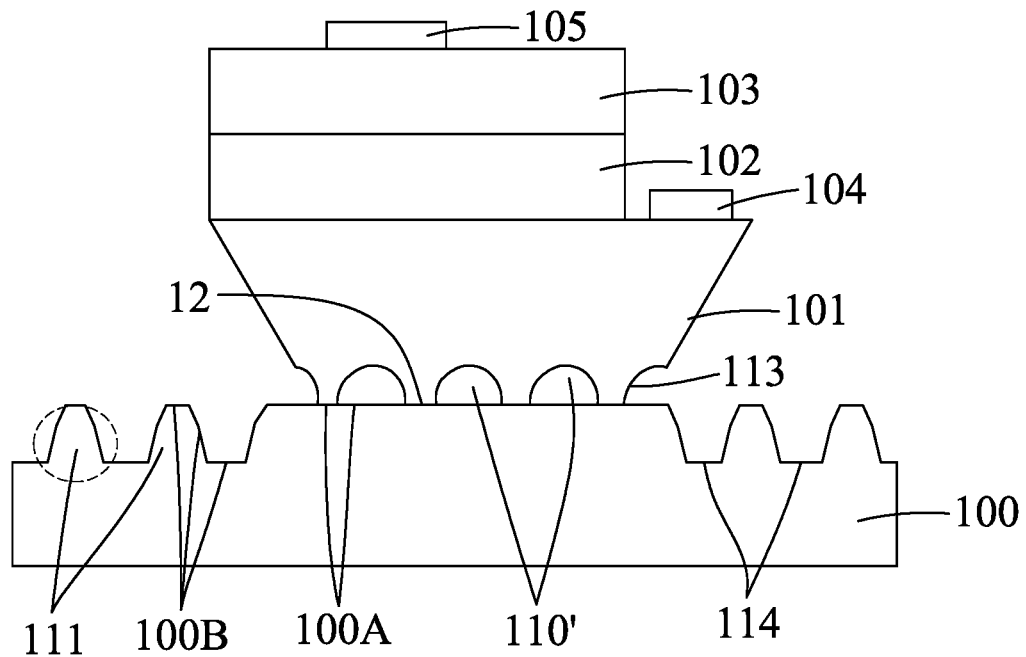
FIG. 12 is a schematic view illustrating a fourth embodiment of the semiconductor light-emitting device according to the disclosure.

Referring to FIG. 12, a fourth embodiment of the semiconductor light-emitting device and the method for manufacturing the same are generally similar to the second embodiment, except that the second convex structures 110" that are disposed on the protruding portions 111 of the second region 100B are removed, so that the top parts of the protruding portions 111 are exposed.

The removal of the second convex structures 110" may be completed during the wet etching process of step D of the method. Alternatively, an additional etching process after step D may be conducted using, for example, but not limited to, buffered oxide etch (BOE) solution.

In addition, the first convex structures 110' that may be exposed from the peripheral wall of the first-type semiconductor layer 101 in step D are also removed to form a cavity 113. The cavity 113 extends from the peripheral wall into an internal portion of the first-type semiconductor layer 101, and is formed with a predetermined depth.

In certain embodiments, an insulating layer is further formed to cover the protruding portions 111 and the recessed portions 114 formed on the second region 100B.

Figure 13:
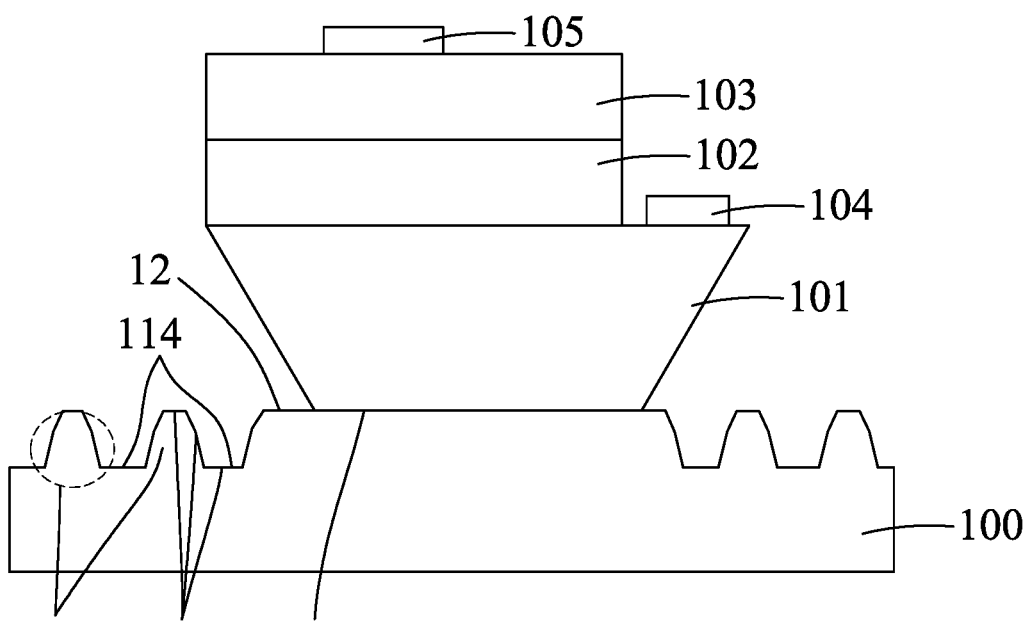
FIG. 13 is a schematic view illustrating a fifth embodiment of the semiconductor light-emitting device according to the disclosure.

Referring to FIG. 13, a fifth embodiment of the semiconductor light-emitting device and the method for manufacturing the same are generally similar to the second embodiment, except that in the fifth embodiment, the first and second convex structures 110', 110" are not formed in step A. In addition, in step D, a patterned mask, such as a patterned photoresist mask, is disposed on the second region 100B, followed by the wet etching process to form the protruding portions 111 and the recessed portions 114, and then the patterned mask is removed.

In the description above, for the purposes of explanation, numerous specific details have been set forth in order to provide a thorough understanding of the embodiment). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

The invention claimed is:

1. A semiconductor light-emitting device, comprising:
   a light-transmissible substrate that is made of a first material and that has a first surface and a second surface opposite to said first surface, said first surface having a first region, and a second region which is formed with a plurality of protruding portions and a plurality of recessed portions formed between said plurality of protruding portions, said recessed portions being disposed at a level lower than that of said first region relative to said second surface; and
   a semiconductor light-emitting stack that is disposed on said first region of said first surface along a stacking direction;
   wherein said first region of said first surface is in direct contact with an entirety of a bottom surface of said semiconductor light-emitting stack, and said first region and said second surface cooperatively define a first minimum distance therebetween; and
   wherein a remaining portion of said first surface other than the first region is said second region, and said second region and said second surface cooperatively define a second minimum distance therebetween, said second minimum distance being smaller than said first minimum distance.

2. The semiconductor light-emitting device of claim 1, wherein said first region is non-planar and is formed with a plurality of protruding portions and a plurality of recessed portions formed between said plurality of protruding portions of said first region, said recessed portions of said second region being at a level lower than said recessed portions of said first region relative to said second surface.

3. The semiconductor light-emitting device of claim 1, wherein said first region is planar.

4. The semiconductor light-emitting device of claim 1, wherein:
   said first region has a first surface area, and a first projected area on an imaginary surface that is perpendicular to the stacking direction,
   said second region has a second surface area, and a second projected area on the imaginary surface that is perpendicular to the stacking direction, and
   a ratio of the second surface area to the second projected area is greater than a ratio of the first surface area to the first projected area.

5. The semiconductor light-emitting device of claim 1, further comprising a plurality of first convex structures that are made of a second material different from said first material, that are formed on said first region, and that are disposed between said light-transmissible substrate and said semiconductor light-emitting stack.

6. The semiconductor light-emitting device of claim 5, wherein said second material has a refractive index smaller than that of said first material.

7. The semiconductor light-emitting device of claim 1, wherein each of said protruding portions of said second region has at least one inclined sidewall that extends in a direction away from said second surface and that has a constant slope, and a top part that connects said inclined sidewall opposite to said second surface and that is formed in one of a point shape and a plate shape.

8. The semiconductor light-emitting device of claim 5, wherein said first region is formed with a plurality of protruding portions on which said first convex structures are formed, and a plurality of recessed portions formed between said plurality of protruding portions of said first region, and a ratio of a height of each of said first convex structures to a height of each of said protruding portions of said first region is not less than 9:1.

9. The semiconductor light-emitting device of claim 1, wherein said semiconductor light-emitting stack includes a first-type semiconductor layer, an active layer, and a second-type semiconductor layer that are sequentially disposed on said first region along the stacking direction away from said first region, said first-type semiconductor layer including an upper surface that is distal from said first surface and a peripheral wall that connects said upper surface and that has at least one inclined surface with an acute angle relative to said upper surface.

10. The semiconductor light-emitting device of claim 5, wherein said first convex structures are formed in curved configurations having non-constant slopes.

11. The semiconductor light-emitting device of claim 1, wherein each of said protruding portions of said second region has a top part and a bottom part respectively distal from and proximal to said second surface, and a ratio of a distance between said top and bottom parts to a width of said bottom part ranges from 1:1 to 1:3.

12. The semiconductor light-emitting device of claim 1, wherein a height of each of said protruding portions of said second region independently ranges from 0.1 µm to 2 µm.

13. A semiconductor light-emitting device, comprising:
   a light-transmissible substrate that is made of a first material and that has a first surface and a second surface opposite to said first surface along a stacking direction, said first surface having
   a first region having a first surface area, and a first projected area on an imaginary surface that is perpendicular to the stacking direction, and
   a second region having a second surface area, and a second projected area on the imaginary surface that is perpendicular to the stacking direction; and
   a semiconductor light-emitting stack disposed on said first region along the stacking direction;
   wherein said first region of said first surface is in direct contact with an entirety of a bottom surface of said semiconductor light-emitting stack, and a remaining portion of said first surface other than the first region is said second region; and
   a ratio of said second surface area to said second projected area is greater than a ratio of said first surface area to said first projected area.

14. The semiconductor light-emitting device of claim 13, further comprising a plurality of first convex structures that are made of a second material different from said first material, that are formed on said first region, and that are disposed between said light-transmissible substrate and said semiconductor light-emitting stack.

15. The semiconductor light-emitting device of claim 14, wherein said second material has a refractive index smaller than that of said first material.

16. The semiconductor light-emitting device of claim 13, wherein each of said protruding portions of said second region has at least one inclined sidewall that extends in a direction away from said second surface and that has a constant slope, and a top part that connects said inclined sidewall opposite to said second surface and that is formed in one of a point shape and a plate shape.

17. A semiconductor light-emitting device, comprising:
a light-transmissible substrate that is made of a first material and that has a first surface and a second surface opposite to said first surface along a stacking direction, said first surface having a first region, and a second region which is formed with a plurality of protruding portions and a plurality of recessed portions formed between said plurality of protruding portions, said first region having a first surface area, and a first projected area on an imaginary surface that is perpendicular to the stacking direction,
said second region having a second surface area, and a second projected area on the imaginary surface that is perpendicular to the stacking direction; and
a semiconductor light-emitting stack that is disposed on said first region of said first surface along the stacking direction;
wherein the first region of the first surface is in direct contact with an entirety of a bottom surface of the semiconductor light-emitting stack, and a remaining portion of the first surface other than the first region is the second region; and
a ratio of the second surface area to the second projected area is greater than a ratio of the first surface area to the first projected area.

18. The semiconductor light-emitting device of claim 17, further comprising a plurality of first convex structures that are made of a second material different from said first material, that are formed on said first region, and that are disposed between said light-transmissible substrate and said semiconductor light-emitting stack.

19. The semiconductor light-emitting device of claim 18, wherein said second material has a refractive index smaller than that of said first material.

20. The semiconductor light-emitting device of claim 18, wherein said first region is formed with a plurality of protruding portions on which said first convex structures are formed, and a plurality of recessed portions formed between said plurality of protruding portions of said first region, and a ratio of a height of each of said first convex structures to a height of each of said protruding portions of said first region is not less than 9:1.

* * * * *